(12) United States Patent
Shindo et al.

(10) Patent No.: US 7,531,947 B2
(45) Date of Patent: May 12, 2009

(54) STACKED PIEZOELECTRIC ELEMENT AND PRODUCTION METHOD THEREOF

(75) Inventors: Hitoshi Shindo, Nishio (JP); Eturo Yasuda, Nishio (JP); Masatoshi Ikeda, Nishio (JP); Masaya Nakamura, Nagoya (JP); Tatsuhiko Nonoyama, Chiryu (JP); Toshiatsu Nagaya, Kuwana (JP)

(73) Assignees: Nippon Soken, Inc., Nishio (JP); Denso Corporation, Kariya (JP)

( * ) Notice: Subject to any disclaimer, the term of this patent is extended or adjusted under 35 U.S.C. 154(b) by 416 days.

(21) Appl. No.: 11/221,299

(22) Filed: Sep. 7, 2005

(65) Prior Publication Data

US 2006/0087204 A1    Apr. 27, 2006

(30) Foreign Application Priority Data

Sep. 7, 2004   (JP)   ............................ 2004-259801
Sep. 7, 2004   (JP)   ............................ 2004-259802

(51) Int. Cl.
*H01L 41/08*   (2006.01)
(52) U.S. Cl. .................... 310/363; 310/364; 310/358; 310/328
(58) Field of Classification Search ................ 310/328, 310/363, 364
See application file for complete search history.

(56) References Cited

U.S. PATENT DOCUMENTS 6,690,571 B2    2/2004   Shindo et al.
6,734,607 B2 *  5/2004   Nagaya et al. .............. 310/363
7,073,265 B2 *  7/2006   Senoo et al. .................. 30/364
2002/0149901 A1  10/2002  Shindo et al.
2004/0121179 A1  6/2004   Kirsten

FOREIGN PATENT DOCUMENTS

| DE | 101 64 354 | 8/2002 |
| DE | 101 20 517 | 11/2002 |
| GB | 776498 | 6/1957 |
| JP | 05-082387 | 4/1993 |
| JP | 05-174612 | 7/1993 |
| JP | 07-34417 | 4/1995 |

OTHER PUBLICATIONS

Office Action dated Jan. 24, 2007 in German Application No. 10 2005 042 520.8 with English translation.

* cited by examiner

*Primary Examiner*—Mark Budd
(74) *Attorney, Agent, or Firm*—Harness, Dickey & Pierce, PLC

(57) ABSTRACT

A stacked piezoelectric element obtained by alternately stacking a piezoelectric ceramic layer and an electrode layer, wherein said electrode layer mainly comprises an electrically conducting base metal electrode material, and the region held between the electrode layer positioned at the top of each ceramic layer and the electrode layer positioned at the bottom of each ceramic layer contains a material having no piezoelectricity, in which a constituent element of said material having no piezoelectricity is uniformly dispersed so as not to have local distribution of a distributed strength exceeding 2 times the distributed strength which is distributed in a largest number of places and is not 0.

4 Claims, 4 Drawing Sheets

STACKED PIEZOELECTRIC ELEMENT AND PRODUCTION METHOD THEREOF

FIELD OF THE INVENTION

The present invention relates to a stacked piezoelectric element obtained by alternately stacking piezoelectric ceramic layers and electrode layers, and a production method thereof. The present invention also relates to an electrode paste material for use in the production of a stacked piezoelectric element.

BACKGROUND OF THE INVENTION

A stacked piezoelectric element in which piezoelectric ceramic layers formed of a PZT-based material or the like having excellent piezoelectric properties and dielectric properties and electrode layers formed of a base metal such as copper are alternately stacked, is being used for an actuator, a capacitor and the like. The method for producing such a stacked piezoelectric element usually comprises the following multiple steps.

A green sheet formed of a ceramic material such as PZT is prepared, and an electrode paste material is coated on this green sheet by screen printing or the like. Subsequently, a desired number of green sheets each coated with the electrode paste material are stacked to produce a stack, and this stack is degreased. The degreased stack is heated in a heating furnace under a reducing condition to reduce the metal oxide in the electrode paste material and form an electrode layer having electrical conductivity (hereinafter referred to as an "electrode reducing step"). Thereafter, this stack is fired to be densified the ceramic material to produce a final stacked piezoelectric material (hereinafter referred to as a "firing step").

In order to obtain a good joined state at the boundary and high durability of the joined state, the ceramic material and the electrode paste material are preferably fired at the same time. However, in the firing step, the electrode paste material and the ceramic material require contradictory atmosphere conditions. More specifically, for example, the ceramic material such as PZT is an oxide and is preferably fired in an oxidizing atmosphere, whereas in order to maintain the electrical conductivity obtained in the electrode reducing step, the electrode paste material is preferably fired in a reducing atmosphere.

In the firing step, when the firing is performed in an oxidizing atmosphere so as to satisfactorily fire the ceramic material, the electrode layer formed of copper or the like, which is reduced in the previous electrode reducing step, is sometimes again oxidized to decrease the electrical conductivity. On the other hand, when the firing is performed in a reducing atmosphere, the ceramic material is reduced to cause a problem that the characteristics of the stack after firing are impaired. The "oxidizing atmosphere" as used herein means an atmosphere condition where, in the stacked product manufactured from a ceramic material and an electrode metal and the atmosphere of the firing step is shifted to the relatively oxidizing side as compared with the peripheral condition allowing for the metal state of the electrode metal and for the-oxide state of the ceramic material. The reducing atmosphere means similarly an atmosphere condition where the atmosphere of the firing step is shifted to the relatively reducing side.

In order to solve the above-described problem, Japanese Unexamined Patent Publication (Kokai) No. 5-82387 describes a method of reducing an electrode paste material in an atmosphere containing a hydrogen gas and, in the subsequent firing step, firing the stack in an atmosphere controlled to an oxygen partial pressure in a specific range.

Also, Japanese Examined Patent Publication (Kokoku) No. 7-34417 describes a method of reducing an electrode paste material at a temperature lower than the firing temperature and in the subsequent firing step and firing the stack by using an $N_2$—$H_2$—$H_2O$—$O_2$ mixed gas in an atmosphere controlled to an $O_2$ partial pressure in a specific range.

According to these conventional methods, the ceramic material can be densified in the firing step almost without oxidizing the electrode layer comprising copper or the like, which is reduced in the electrode reducing step. In addition, there is a known method comprising a step of printing an electrode paste material mainly comprising an electrode metal, which is constituted to contain no oxide or have a small oxide content; a degreasing step of performing degreasing while preventing oxidation of the electrode metal in the electrode paste material by controlling the oxygen partial pressure; and a firing step of densifying the ceramic material.

However, these conventional methods have the problems that, in the case of producing a stack having a large number of layers stacked, the degree of reduction•oxidation reaction can be hardly balanced between the center part and the outer peripheral part of the stack and the adjustment of the atmosphere is very difficult. Also, when the stack has a large shape, an enormous amount of time is required for the removal of binder in the degreasing step before firing or before firing•reduction of the electrode. Furthermore, when a part of the binder remains, the atmosphere in the after step cannot remain uniform due to oxidation of the remaining substance and this adversely affects the quality of the piezoelectric element produced.

PZT, which has been used in recent years, contains Pb as a component element thereof. The oxide of Pb sublimates or liquefies at around 900° C. and then exits from the medium. As a result, the composition changes to cause relative deterioration in the performance as a piezoelectric material. In order to overcome this problem, during production, the amount of Pb-based material, as a starting raw material, is increased in advance, or at the firing of the piezoelectric element, Pb or a Pb feed material is disposed in the periphery of the piezoelectric element, so that a Pb atmosphere can be formed and the composition can be prevented from changing. In some cases, the property peculiar to the oxide of Pb is used the Pb containing material is increased, or another material is added to the oxide of Pb, so that a liquid phase of PbO (or a eutectic substance of PbO and the another material) can be formed to elevate the transmittance of heat and in turn accelerate the sintering, thereby achieving low-temperature sintering.

The PZT material produced by using an oxide of Pb has been aggressively used because the piezoelectric performance is particularly excellent or firing can be performed at a relatively low temperature to allow for broadened selection of the electrode material, though this material is difficult to use when the quality of the product produced is taken into account.

However, due to environmental problems and as Pb is a harmful substance, a piezoelectric material not containing Pb as the constituent element is being demanded. Also, for producing a piezoelectric element at a low cost, the electrode material must be a base metal and not a noble metal. In this case, as described above, both the oxidized state of ceramic material and the reduced state of electrode layer must be established at the same time.

In the case of a Pb-containing piezoelectric material, the firing temperature can be low and therefore, Cu having a relatively low melting point, but not Ni having a high melting point, can be used. Furthermore, as Cu tends to be less ionized as compared with Ni and has a high free Gibbs energy for oxidation, the oxidized amount is small even under a relatively high oxygen partial pressure (about $10^{-6}$ atm) and therefore, Cu can be maintained as an electrically conducting metal by adjusting the reducing atmosphere.

The degree of difficulty in maintaining a metal as an electrically conducting metal can be determined as follows. For example, the impurity determined of a cylinder gas is usually on the order of 0.01 to 1%. For example, in the case of Cu (about $10^{-6}$ atm), even if a slight amount of oxygen is contained therein, the oxygen amount is not at a level to greatly inhibit the adjustment of oxygen partial pressure (the level is equal to or lower than, for example, error in the change of temperature, humidity or the like or in the change of material composition, and the contribution to the degree of oxidation of the electrode material or ceramic material is small).

On the other hand, as for the Pb-free material, studies are at present devoted exclusively to elevate the piezoelectric performance, and two approaches remain as matters to be studied. That is, one approach is to elevate the piezoelectric performance while adding a material of forming a liquid phase due to low-temperature firing and another approach is to perform the firing by employing an electrically conducting base metal material having a high melting point as the electrode material.

For example, as for the electrode metal having a high melting point, Ni is representative of the material usable even at a relatively high temperature (from 1,100° C. to 1,300° C.). Ni is readily oxidized as compared with Cu and therefore, the oxygen partial pressure must be controlled to be lower. However, as described above, the gas for adjusting the atmosphere contain impurities and in fact, as the oxygen partial pressure becomes lower, the noise ascribable to those impurities relatively increases. As a result, although the metal state of electrode layer and the oxide state of ceramic layer are created in some samples, these desired states are not necessarily created in other samples and a poor-quality product results. Also, when it is intended to perform low-temperature firing by using a Pb-free ceramic material, the atmosphere adjustment becomes more difficult when combined with restriction of the oxidized state of, for example, an additive used for the low-temperature firing. Accordingly, in either study, difficulty in adjustment of the atmosphere occurs.

One example of the deterioration in quality of a product when the electrode layer and the ceramic layer are not in respective desired states described above is briefly described below.

When the atmosphere is shifted to the oxidizing side of the optimal atmosphere condition at the time of forming a reducing atmosphere and, for example, at the time of firing, the electrode may be oxidized and, by causing a eutectic reaction with the ceramic layer comprising an oxide material, melted and diffused. Also, when the atmosphere is shifted to the reducing side of the optimal atmosphere, a part of the ceramic layer is reduced and sometimes causes a eutectic reaction with the metal of the electrode layer, giving rise to melting and diffusion of the electrode material. A eutectic reaction readily occurs between a metal and a metal or between an oxide and an oxide. In the case of a combination of metal and oxide, occurrence of a eutectic reaction is extremely rare.

In this way, when the electrode layer and the ceramic layer are not in the respective desired states, the material of an electrode layer and the material of a ceramic layer undertake a eutectic reaction to cause disconnection of the electrode layer in the middle and, as a result, the electrode layer can only partially function and the performance decreases. Other than this, various other problems are possible, such as decrease in the electrical conductivity due to oxidation of the electrode layer, decrease in the insulating resistance due to reduction of the ceramic layer, and loss of piezoelectric property in a part of the ceramic layer material.

At the production of a piezoelectric material, starting raw materials are mixed to give a desired ratio of constituent atoms, but all materials are not consumed to constitute the piezoelectric material compound and there occurs a phenomenon that a small portion of the material fails to encounter a constituent material with which the material should be compounded, and remains without constituting the piezoelectric material compound. This is a well-known phenomenon. As described above, oxides or metals readily undertake eutectic formation•melting with each other, but eutectic formation hardly occurs between an oxide and a metal. Therefore, the firing must be performed without oxidizing the electrically conducting base metal material and at the same time, without reducing the piezoelectric material and the remaining substances. To satisfy this requirement, setting of the atmosphere conditions becomes very difficult. When a material containing Pb, particularly a Pb feed material, is used, sublimation or liquefaction of Pb takes place at the firing and the material readily remains without forming a compound having piezoelectricity.

These problems encountered in the adjustment of atmosphere are greatly affected by the impurities at the atmosphere adjustment and readily arise in the case of a Pb-free material, but the Pb-containing material is not completely free of these problems. Also in the case of a Pb-containing material, the problems encountered in the adjustment of atmosphere may be solved by controlling various conditions necessary for the formation of atmosphere, such as hydrogen partial pressure, but various conditions for the formation of an atmosphere cannot be easily controlled.

Due to difficulty in view of production method, as described above, the electrode material not having piezoelectric performance may flow into the ceramic layer having piezoelectric performance during firing and segregate there, and this causes a problem in the quality of the finished product. In an element where a relatively large material block is segregated, displacement is not caused in the segregated material at the time of applying a voltage to displace the piezoelectric layer, as a result, stress is concentrated on the boundary with the segregated material and, depending on the case, there arises a problem in durability, such as the generation of cracks.

In order to solve these problems, Kokai No. 2002-260951 describes a technique of adding a melting suppressing substance or a melting point elevating substance to an electrode paste material comprising an organic vehicle and an oxide of an electrically conducting base metal material or comprising an organic vehicle, an electrically conducting base metal material and an oxide thereof. As a result, an effect that, even when the electrically conducting base metal electrode is oxidized after firing, the electrically conducting base metal material is not segregated in the ceramic layer is obtained. If the electrode material is not segregated even when oxidized, the difficulty in controlling the atmosphere, which is a common problem in Ni, Cu and/or a compound or mixture thereof as described above, can be overcome. In Kokai No. 2002-260951, the electrically conducting base metal material can be prevented from segregation in the ceramic layer by the above-described addition of a melting suppressing substance or a melting point elevating substance, but it is not indicated whether the added melting suppressing substance or a melting point elevating substance itself is satisfactorily dispersed in the layer.

Furthermore, the added melting suppressing substance or a melting point elevating substance itself has no piezoelectric performance and therefore, similarly to the electrically conducting base metal material, if such a substance is localized in the ceramic layer, a stress is concentrated thereon and this gives rise to generation of cracks. Also, if such a substance is localized in the electrode layer, the electrical conductivity of the electrode is impaired and the piezoelectric performance decreases.

Insofar as a Pb-containing material is used, the problems ascribable to the sublimation or liquefaction peculiar to Pb remain, and instability of quality is still unresolved. As a result, it is considered that, at the time of firing a large piezoelectric element, the Pb content becomes non-uniform in the front, rear, left, right, top and bottom of the element and good performance cannot be fully exerted.

The present invention has been made to solve these problems in conventional techniques.

An object of the present invention is to provide a stacked piezoelectric element with excellent durability, which exhibits an excellent piezoelectric performance irrespective of containing or not containing Pb in the ceramic layer, ensures sufficiently suppressed segregation of the electrically conducting base metal material in the ceramic layer and allows for no segregation of a strengthening substance itself, which is used to suppress the segregation of the base metal electrode material; and an electrode paste material used for the production.

Another object of the present invention is to provide a Pb-free stacked piezoelectric element and a production method thereof. In particular, the present invention provides a method for producing a ceramic product with excellent quality by suppressing the segregation of the electrically conducting base metal material in the ceramic layer, which is caused due to difficulty in the adjustment of atmosphere.

SUMMARY OF THE INVENTION

A first embodiment of the present invention is a stacked piezoelectric element obtained by alternately stacking a piezoelectric ceramic layer and an electrode layer, wherein
the electrode layer mainly comprises an electrically conducting base metal electrode material, and
the region held between the electrode layer positioned at the top of each ceramic layer and the electrode layer positioned at the bottom of each ceramic layer contains a material having no piezoelectricity, in which a constituent element of the material having no piezoelectricity is uniformly dispersed so as not to have local distribution of a distributed strength exceeding 2 times the distributed strength which is distributed in a largest number of places and is not 0.

A second embodiment of the present invention is a stacked piezoelectric element obtained by alternately stacking a piezoelectric ceramic layer and an electrode layer, wherein
the piezoelectric ceramic layer mainly comprises an alkali niobate compound.

DETAILED DESCRIPTION

Figure 1:
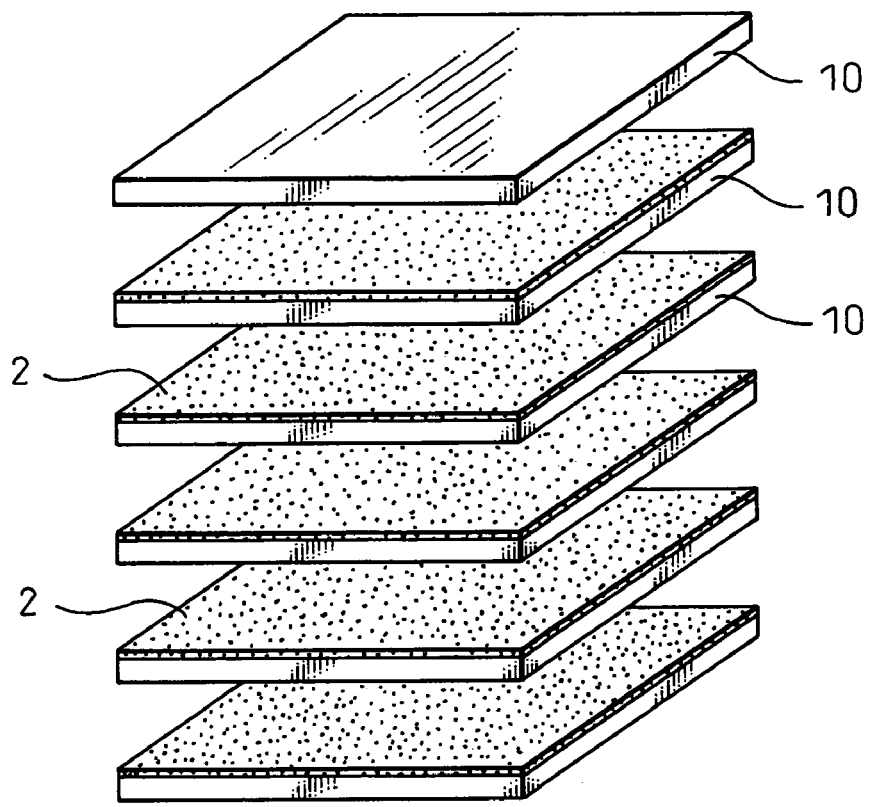
FIG. 1 is an explanatory view showing the stacked structure of the piezoelectric ceramic layer in Example 1.

In the first embodiment of the present invention, the "electrode layer" means an electrode layer sandwiched between two, upper and lower, ceramic layers and as long as it plays the role of applying an electric field to the ceramic layer, the electrode layer of the present invention may take any form, for example, may protrude outside, may be divided into a plurality of electrodes or may serve as a partial electrode. On the contrary, an electrode not fulfilling the role of applying an electric field to the ceramic layer, for example, an electrode having only a function of supplying, like an external electrode, an electric current to the electrode layer and not directly affecting the driving of the ceramic layer is excluded from the electrode layer of the present invention even if it takes a form that a part of such an electrode layer is between upper and lower ceramic layers. The "electrode layer" according to the present invention is sometimes referred to as an internal electrode layer.

In the first embodiment of the present invention, the distributed strength of a constituent element of the material having no piezoelectricity in the region held between the electrode layer positioned at the top of each ceramic layer and the electrode layer positioned at the bottom of each ceramic layer is limited. The "constituent element of the material having no piezoelectricity" as used herein means an element which is not the main component of the ceramic layer and, more specifically, an element added from the beginning not for the purpose of providing the performance of the piezoelectric ceramic layer, as in the case where a material contained in the printing layer formed of an electrode paste material before firing is diffused into the ceramic layer.

The distribution of the constituent element is measured by using an electron probe microanalyzer (EPMA, measuring conditions are such that accelerating voltage:. 20 kV, current: $1 \times 10^{-7}$ A, number of pixels: 256×256, 20 ms per 1 pixel, and magnification: 700 times). The distribution of the constituent element on the surface cut in the direction perpendicular to the electrode face of the stack, that is, on the cross-sectional surface where the alternately stacked state of ceramic layer and electrode layer can be observed, is surface-analyzed.

The term "is not 0" in the notation of "distributed strength which is distributed in a largest number of places and is not 0" is a notation for specifying the strength setting of a component element found to contain a noise as a result of the above-described surface analysis by EPMA. That is, the portion of a so-called undetectable level, where the X-ray peak peculiar to each component element hides behind a noise and does not appear, is compared by specifying the strength setting to not allow for the presence of the component element. As for the portion where the strength is distributed in a largest amount, the numerical value varies depending on the setting of maximum strength, but this has no effect, because the comparison of the present invention is made by the ratio of distributed strength.

The value of the "distributed strength which is distributed in a largest number of places and is not 0" is calculated from the average distributed strength in the portion where the constituent element is distributed with good dispersity in the ceramic layer under the above-described strength setting. As for the method of simply and easily figuring the numerical value, a method of using a value obtained by averaging distributed strengths in about 100 places is used.

In the first embodiment of the present invention, the distributed state of the specific constituent element is limited "not to have local distribution of a distributed strength exceeding 2 times", whereby an excellent operational effect can be obtained. More specifically, the sites of individual constituent elements are present like microparticles and are distributed microscopically in a scattered manner, and each particle diameter is small.

The Rayleigh scattering of light is inversely proportional to the 4th power of the particle diameter and the light is transmitted as if the particles are not present. Similarly to this case, as the displacement is a wave as well as light, creation of the microparticle state seems to decrease the reflection and scattering of the displacement wave. In addition, the constituent element in the microparticle state is intervening in the particle-to-particle space of the piezoelectric material and therefore, the piezoelectric material can undergo relatively free fluctuation, as a result, the concentration of stress is relieved and the problem of stress is mitigated. It is particularly preferred that local distribution of a distributed strength exceeding 1.5 times is not present.

In the stacked piezoelectric element according to the first embodiment of the present invention, for example, a PZT-based material {this is a generic term of oxides having a $Pb(Zr, Ti)O_3$-type perovskite structure and includes a material where Pb, Zr and Ti each is partially replaced} can be used as the ceramic material. Other than this, a material not containing Pb as a component element, such as $KNbO_3$, $LiNbO_3$ and $BaTiO_3$, can also be used.

The Pb-free material is not limited to these materials. When the oxide is denoted as $ABO_3$, the A-site and B-site atoms (elements) each may comprise two or more atoms (elements). Also, this compound is the main component. Therefore, a slight amount of a material may be added so as to enhance, for example, sinterability, various performances and strength, and the additive added in a slight amount may be a material having no piezoelectricity.

In the stacked piezoelectric element according to the first embodiment of the present invention, the electrically conducting base metal electrode material preferably has a larger standard Gibbs free energy of producing a metal oxide at the sintering temperature than that of the ceramic material constituting the piezoelectric ceramic layer.

The "sintering temperature" as used herein indicates, when the change in density with respect to the temperature is graphed, a temperature at the intersection of the tangent line in the region where the density is saturated on the high temperature side, and the tangent line in the region where the density is significantly changed, that is, a sintering termination temperature. However, when the production method is clearly known, the highest temperature under the firing conditions may be used instead, because the firing is usually performed at a sintering termination temperature or at a temperature in the vicinity thereof.

The term "a larger standard Gibbs free energy of producing a metal oxide" means to be "difficult to be oxidized". For example, at 1,000° C., the Gibbs free energy is about −40 for producing an oxide of Cu, about −15 for producing an oxide of Pb and about 60 for producing an oxide of Ni, and Cu, Pb and Ni in this order are less oxidizable.

According to the this embodiment of the present invention, an electrode layer in the satisfactorily reduced state and a piezoelectric ceramic layer in the satisfactorily oxidized state are obtained. That is, the stacked product of an electrode material and a ceramic material can be integrally and simultaneously fired, and firmer electrode-ceramic joining can be realized. In the electrode layer, a part of the electrically conducting base metal material may be oxidized if the electrical conductivity is not impaired.

At the production of a piezoelectric material, starting raw materials are mixed to give a desired ratio of constituent atoms, but all materials are not consumed to constitute the piezoelectric material compound and, as is well known, there occurs a phenomenon that, for example, due to partial attachment or slight non-uniformity at the kneading, a small portion of the material fails to encounter a constituent material with which the material should be compounded, and remains without constituting the piezoelectric material compound. As oxides or metals readily undertake eutectic formation•melting with each other and the eutectic formation hardly occurs between an oxide and a metal, firing must be performed without oxidizing the electrically conducting base metal material and at the same time, without reducing not only the piezoelectric material but also the remaining substance. To satisfy this requirement, setting of the atmosphere conditions is very difficult. However, in the first embodiment of the present invention, the electrically conducting base metal material used has a larger standard Gibbs free energy of producing a metal oxide at the firing temperature than that of the ceramic material constituting the piezoelectric ceramic layer, so that the probability of causing the electrically conducting base metal material to be oxidized at the firing temperature can be lessened and setting of the atmosphere conditions can be facilitated.

In the first embodiment of the present invention, the region held between the electrode layers positioned at the top and the bottom of each ceramic layer preferably has no segregation of a compound containing a component element of the electrically conducting base metal material constituting the electrode layer. Segregation of the electrode material not only brings about concentration of a stress but also, due to decrease in the abundance ratio of the electrode material in a predetermined place, sometimes causes discontinuity of the electrode. Therefore, segregation is preferably not present and, also, the amount of the component element-containing compound diffused into the ceramic layer is preferably smaller. The term "segregation of the electrode material" as used herein means that in the strength as measured by EPMA, the component element-containing compound exhibits a strength distribution of 40% or more based on the maximum strength of the electrode material in the electrode part. In the case of a strength distribution of 40% or less, this is called diffusion.

In the first embodiment of the present invention, the main component of the electrically conducting base metal material constituting the electrode layer is preferably Cu, Ni or a mixture, alloy or compound containing Cu and Ni. The base metal electrode material is preferably Cu because of its good electrical conductivity and high melting point, and is preferably Ni having a higher melting point. Cu and Ni are represented by a phase equilibrium diagram of completely solid solution system, so the melting point of the Cu+Ni mixture or compound (alloy) cannot be lower than that of Cu,.a Cu+Ni mixture maybe used or a Cu+Ni compound (alloy) may be used. Also, as long as a problem does not arise due to decrease in the electrical conductivity or in the melting point, another material may be contained in the electrically conducting base metal material.

In the first embodiment of the present invention, the constituent element of the material having no piezoelectricity, which is uniformly dispersed in the region held between the electrode layers positioned at the top and the bottom of ceramic layer, is preferably Ca. The "constituent element of the material having no piezoelectricity" as used herein means an element which is added from the beginning not for the purpose of forming the performance of the piezoelectric ceramic layer, that is, an element which is not the main component, as in the case where a material contained in the printing layer formed of an electrode paste material before firing is diffused into the ceramic layer.

The method for judging the material which is added not for the purpose of forming the performance of the piezoelectric ceramic layer is described below. In the case of a material added for the purpose of forming the performance of the piezoelectric ceramic layer, in the constitution of the ceramic layer material, the material having a perovskite structure of $ABO_3$ is denoted by two ways, that is, $(A_1,A_2)(B_1,B_2)O_3$ and $A_1B_1O_3+A_2B_2O_3$.

The former is a notation method of parenthesizing the A-site constituent elements, parenthesizing the B-site constituent elements, and subsequently adding 3 oxygen elements. At this time, the constitutional ratio of elements in respective sites may be affixed. The latter is a method of denoting the A-site elements and B-site elements in the material by dividing these into combinations each forming a crystal structure at a high ratio. Also, at this time, the constitutional ratio may be affixed. Even constituent element is added for the purpose of forming the performance of the piezoelectric ceramic layer, a material not included in the perovskite structure is additionally denoted after the above-described notation by using a desired chemical formula in many cases.

In the above-described notation system, Ca is not included. That is, in a material not containing Ca as the main component, when Ca intrudes on the way of process such as sintering, Ca may accidentally enter into the A-site of the perovskite structure, as a result, a Ca-containing piezoelectric material may be partially formed. Although a site of Ca compound not exhibiting piezoelectricity is also partially present, the Ca-containing piezoelectric material formed above does not locally create a boundary with the Ca compound having no piezoelectricity and takes a constitution such that the ratio between the portion having piezoelectricity and the portion having no piezoelectricity is continuously changed. Therefore, displacement of the portion exhibiting piezoelectricity continuously decreases and is connected to the portion not exhibiting piezoelectricity, as a result, the stress is not concentrated on one point but is relieved. That is, strong joining is obtained at the boundary between a particle and a particle. Furthermore, as Ca is not included as the main component, the joining strength can be enhanced without greatly impairing the piezoelectric performance.

In the first embodiment of the present invention, an electrode paste material mainly comprising an organic vehicle and an electrically conducting base metal material or mainly comprising an organic vehicle, an electrically conducting base metal material and an oxide thereof is used, wherein the electrically conducting base metal material has a larger standard Gibbs free energy of producing a metal oxide at the sintering temperature than that of the ceramic material constituting a piezoelectric ceramic layer on which the electrode paste material is printed, and a strengthening substance is added, which has an activity of preventing a component element of the electrically conducting base metal material from segregation in the piezoelectric ceramic layer when the electrode paste material is printed on a ceramic sheet working out to the piezoelectric ceramic layer and at least stacking, press-bonding, degreasing and firing are performed, and allowing for no segregation of a component element of the strengthening substance itself.

When such an electrode paste material is used, by virtue of the presence of the strengthening substance, the electrode can be prevented from segregation at the firing and at the same time, the strengthening substance itself does not segregate, whereby the durability on causing displacement of the stacked piezoelectric element obtained is enhanced and a tough stacked piezoelectric element can be obtained.

It is preferred that the strengthening substance comprises a component element such that when the component element is converted into an oxide, the oxide has nearly the same crystal structure as the oxide of the electrically conducting base metal material and has a melting point higher than that of the oxide of the electrically conducting base metal material, which has nearly the same crystal structure, and the main component of the strengthening substance is an organic compound.

It is also preferred that the strengthening substance comprises a component element such that when the component element is converted into an oxide, the oxide has nearly the same crystal structure as the material constituting the piezoelectric ceramic layer and has a melting point higher than that of the material constituting the piezoelectric ceramic layer and having nearly the same crystal structure, and the main component of the strengthening substance is an organic compound.

Furthermore, it is preferred that the strengthening substance comprises a component element such that, when the component element is converted into an oxide, the oxide has nearly the same crystal structure as a eutectic substance of the oxide of the electrically conducting base metal material and the material constituting the piezoelectric ceramic layer and has a melting point higher than that of the eutectic substance having nearly the same crystal structure, and the main component of the strengthening substance is an organic compound. The main component of the electrode paste material consists of a metal for the objective electrode and/or an oxide thereof and an organic vehicle, and the strengthening substance added thereto is preferably an organic compound.

An organic material and an organic material are readily mixed and therefore, aggregation ascribable to difficulty in mixing seldom occurs. The strengthening substance as the mixed organic material has high dispersibility. Also, segregation of the substance mixed as the strengthening substance hardly occurs after firing.

For these reasons, the strengthening substance physically inhibits progress of a eutectic reaction between the electrode material or a part thereof and the ceramic material or a part thereof or progress of melting along the eutectic reaction, so that segregation of the electrode material in the ceramic layer can be suppressed.

The physical inhibition may also be considered to result because the strengthening substance intervenes between the electrode material or a part thereof and the ceramic material or a part thereof, which can undergo eutectic formation•melting, as a result, the reaction therebetween is inhibited.

In addition, it is considered that when the progress of the eutectic reaction or melting along the eutectic reaction is disturbed, the amount of the liquid phase produced decreases to prevent a eutectic reaction product from flowing into a cavity in the ceramic layer which is not sintered or not yet thoroughly sintered, or the production of liquid phase is retarded to allow for progress of sintering of the ceramic layer and decrease the cavity in the ceramic layer. As a result, the permeation of melted substance is not concentrated on a part and segregation is suppressed.

The "nearly the same crystal structure" is described in detail below but this may be sufficient if the class of at least the crystal structure is the same, and the lattice constant or angle may differ. The substances having nearly the same crystal structure may take a form of complete solid solution system in the phase equilibrium diagram and, unlike a eutectic substance, a phenomenon of causing melting at a temperature lower than the melting point of each single substance does not occur, so that the effect of suppressing the segregation can be exerted. This is on the condition that the melting point of the strengthening substance is not lower than that of each objective material so as not to allow for melting of the strengthening substance itself as well as formation of a eutectic substance.

In the foregoing, the description is made with respect to the complete solid solution system or eutectic system, but irrespective of the name of phase equilibrium diagram, the system may be sufficient if the melting point does not decrease by the addition of the strengthening substance and the eutectic formation-melting can be suppressed. Accordingly, for example, a phase equilibrium diagram of a composite system is within the objective range. Furthermore, the eutectic formation and melting may be suppressed without causing mixing with the objective substance and this is regarded as having the same effect.

It is known that, although the same applies to all additives and constituent materials, when the size becomes as small as tens of nm, a quantum size effect appears and the melting point decreases. Therefore, it is preferred to increase the number of very small particles as little as possible. The upper limit of the size is preferably a size of ensuring thorough sintering and is smaller than the thickness of each objective layer. The "material constituting the piezoelectric ceramic layer" is not limited to the main component but indicates a material which readily undergoes eutectic formation•melting, and a low-temperature sintering aid and the like are within the objective range.

It is preferred that the strengthening substance comprises a component element such that when the component element is converted into an oxide, the oxide has nearly the same crystal structure as the oxide of the electrically conducting base metal material and has a melting point higher than that of the oxide of the electrically conducting base metal material, which has nearly the same crystal structure, and the main component of the strengthening substance is a compound having a strong covalent bonding property.

It is also preferred that the strengthening substance comprises a component element such that, when the component element is converted into an oxide, the oxide has nearly the same crystal structure as the material constituting the piezoelectric ceramic layer and has a melting point higher than that of the material constituting the piezoelectric ceramic layer and having nearly the same crystal structure, and the main component of the strengthening substance is a compound having a strong covalent bonding property.

Furthermore, it is preferred that the strengthening substance comprises a component element such that when the component element is converted into an oxide, the oxide has nearly the same crystal structure as a eutectic substance of the oxide of the electrically conducting base metal material and the material constituting the piezoelectric ceramic layer and has a melting point higher than that of the eutectic substance having nearly the same crystal structure, and the main component of the strengthening substance is a compound having a strong covalent bonding property.

The main component of the electrically conducting base metal material is preferably Cu, Ni or a mixture, alloy or compound containing Cu and Ni. In this case, an electrode layer being readily joined with the piezoelectric ceramic layer and having good electrical conductivity can be obtained.

When the main component of the electrically conducting base metal material is Cu, the atmosphere for reducing the electrode material while suppressing the reduction of the piezoelectric material, such as oxygen partial pressure and hydrogen partial pressure, has a wide allowable range, and the control of partial pressure becomes relatively easy. On the other hand, when the main component is Ni, firing can be performed at a relatively high temperature because Ni has a high melting point. As low-temperature sintering need not be taken account of, the piezoelectric ceramic material is widened in the range of selection-study and, as a result, a less reducible piezoelectric material can be employed to facilitate the reduction firing or a piezoelectric material having a higher performance, can be selected.

It is preferred that the component element of the strengthening substance takes, when converted into an oxide, a rock salt structure. NiO takes a rock salt structure at a high temperature and therefore, the strengthening substance is preferably a material which has a rock salt structure when converted into an oxide.

It is also preferred that the component element of the strengthening substance takes, when converted into an oxide, either a cuprite structure or a monoclinic structure. In the case where the electrically conducting base metal as the main component of the electrode layer is Cu, the component element of the strengthening substance preferably has, when converted into an oxide, the same crystal structure as the oxide of the main component (CuO or $Cu_2O$), that is, a cuprite structure or a monoclinic structure. Also, as CaO has a rock salt structure, the component element of the strengthening substance is preferably Ca.

Out of the component elements of the strengthening substance, the "compound having a strong covalent bonding property" is not a material having a strong ion bonding property where both ends of each bond part are constituted by an atom readily becoming a minus ion and an atom readily becoming a plus ion when ionized, and the two atoms give a valence sum of 0, but is a material constituted such that the valences are 3, 4 and 5 and when the bond is regarded as being shared with the atom at the other end, the sum of bonds becomes 8. When the covalent bonding property is strong, solubility in the organic vehicle mainly comprising a covalent bond is somewhat increased and the dispersibility is enhanced and, as a result, the material can be an additive which does not segregate. Other operational effects are the same as in the case where the main component is an organic compound.

Examples of the organic compound containing the component element Ca include dimethoxy calcium, diethoxy calcium, di-n-butoxy calcium, di-i-propoxy calcium, di-n-propoxy calcium, di-i-butoxy calcium and di-sec-butoxy calcium.

When the organic compound containing the component element Ca for the strengthening substance is added and a stacked product is formed, an organic material is gasified and diffused through decomposition•desorption also from the newly added organic material and therefore, the joining at the interface between the electrode part and the ceramic part must be more strengthened. For this purpose, a ceramic material having nearly the same composition as the material of the ceramic layer is preferably added in advance as a further additive to the electrode paste material. In other words, the electrode paste material preferably comprises a ceramic material having nearly the same composition as the material of the ceramic layer.

The term "nearly the same composition" as used herein means a material having almost the same crystal structure (for example, in the case of a perovskite structure, the lattice constant or angle may differ) as the material of the ceramic layer, where some constituent elements may be omitted or newly added.

This is described in more detail below. The material may be sufficient if the name and class of the crystal structure are the same, and the lattice constant and angle of the crystal structure need not be the same. For example, $BaTiO_3$ as a representative piezoelectric material has a perovskite structure. In PZT having the same perovskite structure, a large number of materials having a crystal structure in the same class, such as $SrTiO_3$, are known. These are subdivided into cubic, tetragon, rhombohedral, prismatic, and the like, by the difference in the lattice constant or angle of the crystal structure. For example, as for the difference between cubic and tetragon, the anisotropy of lattice is only a difference of about 1 or 2% of the lattice constant and in many cases, a large difference is substantially not present in the atomic position. Therefore, the material is not limited by the subdivided structure class but limited by the major division. Needless to say, even if the class is the same, when the difference of the lattice constant is as large as 10%, the crystal structure is very probably fractured and, therefore, the case where the difference of lattice constant is 5% or more is excluded.

The constituent element omitted is preferably an element of, assuming that this constituent element is present as an impurity in the form of an oxide or the like, readily undertaking a eutectic reaction with the oxide resulting from oxidation of the electrically conducting base metal material of the electrode layer. On the contrary, the newly added constituent element is preferably a material having, even if this constituent element is forming an oxide or the like as an impurity, no possibility of causing a eutectic reaction with the oxide resulting from oxidation of the electrically conducting base metal material of the electrode layer.

In the case that the ceramic material is the alkali niobate compound, constituent elements other than Nb may be added to the B site. In the A site, the rate of the alkali element, for example, Na or K may vary at any rate, and the number of constituent elements can be also increased and decreased. In this case, since the B site comprises only Nb, the example that the number of constituent elements of B site increases and decreases is described. However, in the case that B site of the ceramic material comprises one or more element, the number of constituent elements of B site can be described. The increased element is preferably an element which does not cause melting reaction with an electrode material and a ceramic material. On the contrary, the decreased element is an element which causes melting reaction with an electrode material and a ceramic material. With respect to the material which has no relevant to melting, there are not any limitations.

In the foregoing pages, it is described that the present invention is preferably constituted to avoid a eutectic reaction, but the eutectic reaction is not completely rejected and if the amount of a eutectic substance formed by the eutectic reaction is relatively small, a eutectic reaction may take place. The amount of a eutectic substance can be calculated-from the impurity amount and the compositional ratio at the eutectic point in the phase equilibrium diagram. The amount of impurity as the further additive is originally small and therefore, it may be sufficient if the eutectic reaction does not bring about an extreme case that a eutectic substance in an amount of about 10 times the impurity amount is formed to give a compositional ratio of 90% at the eutectic point. The important matter is the amount of the eutectic reaction substance with the electrically conducting base metal material of the electrode layer and the material of the ceramic layer, and this is of course dependent on the purity of the further additive. The further additive is limited here by the crystal structure•composition, but it is of course possible that this material is used as the main component and a material of not causing a eutectic•melting reaction with the electrically conducting base metal material of the electrode layer, with the ceramic material or with the eutectic substance of the electrically conducting base metal material and the ceramic material is contained as a sub-component.

In the electrode paste material, the molar content ratio of the oxide of Ni is preferably 30% or less based on the total amount of Ni and the oxide thereof. Ni has a stronger tendency to ionization than H and also tends to have a low oxidation-reduction potential. For example, there is a production method where Cu is used as the electrode material in the stacked piezoelectric element using PZT for the piezoelectric ceramic layer and after coating an electrode paste material comprising Cu and a Cu oxide and performing stacking, press-bonding and degreasing, the electrode is reduced with $H_2$ having a strong reducing power to ensure the electrical conductivity of the electrode layer and then the stack is fired. However, when Ni is used, even if it is intended to ensure the electrical conductivity by performing reduction with use of $H_2$ through the same construction•procedure, a satisfactorily reduced state may not be obtained, because the reducing ability is relatively weak. Therefore, in the case of forming an electrode layer mainly comprising Ni, the molar content ratio of the oxide of Ni in the electrode paste material is preferably 30% or less. Even if Ni is oxidized in the process, the stability of the oxidized state is less than the case of using oxidized Ni from the beginning, and reduction can be effected to a certain extent. In order to unfailingly ensure the electrical conductivity, the above-described content ratio is preferred.

The method for producing the stacked piezoelectric element of the first embodiment of the present invention comprises at least an electrode printing step of coating an electrode paste material on at least one surface of a ceramic green sheet produced by shaping a ceramic material into a sheet form, a press-bonding step of stacking and press-bonding the ceramic green sheets each coated with an electrode paste material to produce a stack, a degreasing step of degreasing the stack, and a firing step of firing the stack in a reducing atmosphere to produce a stacked piezoelectric element.

This production method is characterized by using the above-described electrode paste material having excellent effects. Therefore, the following excellent operational effect are obtained.

That is, in the reduction firing, when the temperature is high, the ceramic material and the electrode material must be maintained to be an oxide and a metal, respectively, by continuously adjusting•controlling a gas having oxidizing•reducing power, for example, to a desired oxygen partial pressure.

If the electrode material is extremely oxidized, the electrical conductivity decreases and the material does not function as the electrode. Furthermore, the oxidized electrode material causes a eutectic reaction with the material (oxide) of the ceramic layer and melts to allow for diffusion and segregation of the electrode material in the ceramic layer. Even if the electrode is returned to a metal in any way and the electrical conductivity is recovered, when the ceramic layer is displaced, displacement does not occur because the electrode material segregated in the ceramic layer has no piezoelectricity and, as a result, the stress is concentrated on the periphery of the segregated electrode material and the piezoelectric element suffers from poor durability. In addition, diffusion of the electrode material in the ceramic layer causes a problem that the electrode material in the electrode layer is lacking and the electrode is disconnected.

On the other hand, if the ceramic material is extremely reduced, not only the piezoelectric performance but also the insulating resistance value decreases and no potential difference is formed by the electrode layers above and below the piezoelectric ceramic layer to allow for electric conduction. Furthermore, the reduced ceramic material component causes a eutectic reaction with the electrode material and melts, as a result, the electrode material diffuses into the ceramic layer and segregates there to generate the same problems as described above.

In order to solve this problem, when a strengthening substance capable, even if the reduction firing atmosphere is somewhat shifted to the oxidizing side from the desired condition, of preventing the component element of the electrically conducting base metal material from segregation in the ceramic layer is added to the electrode paste material, the allowable range for the adjustment of reducing atmosphere is widened and the atmosphere adjustment is facilitated. At this time, the disconnection of electrode can be completely overcome by suppressing the diffusion•segregation of electrode material, but the effect on durability by the segregation of the material having no piezoelectric performance in the ceramic layer must be dealt with by taking account of not only the electrode material but also the material added for suppressing the segregation of electrode material in the ceramic layer and this problem can be solved by adding a strengthening substance comprising a material having an organic material structure or constitution and/or having a strong covalent bonding property.

The second embodiment of the present invention is a stacked piezoelectric element obtained by alternately stacking a piezoelectric ceramic layer and an electrode layer, wherein the piezoelectric ceramic layer mainly comprises an alkali niobate compound.

The problems ascribable to sublimation or liquefaction of Pb in the stacked piezoelectric element using a Pb-containing material can be lessened as described above but, at the time of firing a large stacked piezoelectric element, the Pb content becomes non-uniform at the front, rear, left, right, top and bottom, and a good performance cannot be satisfactorily exerted in some cases. The second embodiment of the present invention is a Pb-free stacked piezoelectric element. This embodiment includes a production method of the Pb-free stacked piezoelectric element.

The "electrode layer" in the second embodiment of the present invention has the same meaning as the electrode layer in the first embodiment.

In the stacked piezoelectric element of the second embodiment of the present invention, the main component of the piezoelectric ceramic layer comprises an alkali niobate compound and does not contain Pb. By virtue of this constitution, the stacked piezoelectric element of the second embodiment is an environment-friendly element of generating no harmful substance at the production or disposal. Also, as Pb is not contained, the element can be free from problems ascribable to sublimation or liquefaction of Pb and have excellent quality. Furthermore, among various Pb-free piezoelectric materials, the alkali niobate compound has excellent piezoelectric performance. Therefore, the stacked piezoelectric element using this compound as the main component of the piezoelectric ceramic layer can exert excellent piezoelectric performance and can be wide in its application range to, for example, an actuator.

The alkali niobate compound is a generic term of compounds where the A site comprises one or more alkali metal as represented by K, Na, Li or the like and the B site comprises Nb or multiple elements of Nb and a pentavalent element such as Ta, and examples thereof include $KNbO_3$, $(K, Na)NbO_3$, $(K, Na)(Nb, Ta)O_3$, $K(Ta, Nb)O_3$, $LiTaO_3$, and a solid solution thereof.

In the second embodiment, the electrode layer preferably mainly comprises an electrically conducting base metal material. In this case, as the electrode layer mainly comprises an electrically conducting base metal material, a joining layer comprising a slight amount of a eutectic substance produced by the eutectic reaction between the ceramic material and the electrically conducting base metal material is formed, and a stacked piezoelectric element having good joining strength can be obtained.

The above-described electrically conducting base metal material preferably has a larger standard Gibbs free energy for producing a metal oxide at the sintering temperature than that of the ceramic material constituting the piezoelectric ceramic layer. The "sintering temperature" as used herein has the same meaning as that described for the first embodiment.

The electrode layer mainly comprises an electrically conducting base metal material having a larger standard Gibbs free energy for producing a metal oxide at the sintering temperature than that of the ceramic material constituting the piezoelectric ceramic layer, so that firing can be performed while suppressing both oxidation of the electrode layer material and reduction of the ceramic layer material and therefore, integral firing can be performed. As a result, a stacked piezoelectric element having a stronger join between the electrode and the piezoelectric ceramic layer can be obtained. In the electrode layer, a part of the electrically conducting base metal may be oxidized if the electrical conductivity is not impaired.

The term "a larger standard Gibbs free energy for producing a metal oxide" has the same meaning as that described for the first embodiment of the present invention.

Also, a strengthening substance or a constituent element thereof for enhancing the joining strength of the electrode layer to the piezoelectric ceramic layer is preferably distributed in the vicinity of the boundary (boundary and/or its vicinity) between the electrode layer and the piezoelectric ceramic layer. In this case, by virtue of distribution of the strengthening substance in the vicinity of the boundary between the electrode layer and the piezoelectric ceramic layer, an element having a stronger join can be obtained. In the second embodiment of the present invention, the strengthening substance may be contained in either the ceramic material or the electrode paste material at the production, or a substance originally contained may be changed in the process after stacking and become a material enhancing the joining strength. That is, the material for enhancing the joining strength may be originated in either the starting material or the production process.

It is preferred that the strengthening substance or a constituent element thereof for use in the present invention comprises a material, when present together with the material constituting the piezoelectric ceramic layer, not decreasing the melting point of the material constituting said piezoelectric ceramic layer, or is an element constituting a material not decreasing the melting point.

When the strengthening substance is such a material, the problem of avoiding melting due to oxidation/reduction during firing need not be taken account of. The melting as used herein means a phenomenon caused by the eutectic reaction occurring between an oxide and an oxide or between a metal and a metal. However, the eutectic reaction is not a phenomenon that always occurs between an oxide and an oxide or between a metal and a metal but takes place when the phase equilibrium diagram is a eutectic system, and this phenomenon may also occur when a part of the phase equilibrium diagram is a eutectic system.

The ceramic material is an oxide and, therefore, when melting by the eutectic reaction is not caused between the ceramic material and the oxide of the strengthening substance or a constituent element thereof, this is sufficient.

This is described in more detail. Preferably, melting by the eutectic reaction is not caused within the range of temperature described below. The main component or sub-component of the material constituting the piezoelectric ceramic layer, the raw material capable of producing the main component, and the intermediate product produced in the process of producing the main component are produced, do not cause the eutectic reaction in temperature regions where the respective product is produced.

Also preferably, melting by the eutectic reaction is not caused between the components described below. Melting by the eutectic reaction is not caused between the main component or sub-component of the material constituting the piezoelectric ceramic layer, the raw material capable of producing the main component, and the intermediate product produced in the process of producing the main component are produced and the strengthening substance or the oxide of the strengthening substance or a constituent element thereof.

At least the materials-constituting the ceramic material are present even at the firing maximum temperature and therefore, it is preferred not to cause a eutectic reaction with a readily melted material, for example, a material having a low melting point, out of those materials. Of course, this applies to a sub-component added for enhancement of sinterability, low-temperature firing, or the like. When a eutectic reaction does not occur between the ceramic material, which is an oxide, and the strengthening substance or an oxide thereof, the atmosphere on the oxidizing side can have a deviation allowable range in the step requiring the atmosphere adjustment, such as firing, the adjustment of atmosphere is facilitated and, as a result, an objective can be obtained without causing melting. The reason why, when a eutectic reaction does not occur between the ceramic material and the strengthening substance or an oxide thereof, this facilitates the adjustment of atmosphere is described in detail later.

Furthermore, even when any one of the main component or the sub-component of the ceramic material constituting the piezoelectric ceramic layer, the raw material capable of producing the main component, and the intermediate product temporarily produced in the process of producing the main component is reduced, the reduction product preferably causes no eutectic reaction with the strengthening substance or a reduced substance thereof. When there occurs no eutectic formation and melting in both of oxidation and reduction atmosphere, the atmosphere adjustment is more facilitated.

It is also preferred that the strengthening substance or a constituent element thereof for use in the second embodiment of the present invention comprises a material, when present together with the electrically conducting base metal material constituting the electrode layer or an oxide thereof, not decreasing the melting point of the electrically conducting base metal material constituting the electrode layer or an oxide thereof, or is an element constituting the material not decreasing the melting point. By this constitution, the strengthening substance can inhibit the eutectic reaction between the ceramic material and the oxide of the electrode material, so that the melting resistance can be enhanced and the atmosphere adjustment can be facilitated similarly to the above.

Furthermore, it is preferred that the strengthening substance or a constituent element thereof comprises a material, when present together with a eutectic substance produced after firing only the material constituting the piezoelectric ceramic layer and the electrically conducting base metal material constituting the electrode layer or an oxide thereof, not decreasing the melting point of the eutectic substance, or is an element constituting the material not decreasing the melting point. In this case, the formation of melting substance by the eutectic reaction and the acceleration of eutectic reaction are eliminated but, on the contrary, the eutectic reaction between the ceramic material and the electrode material or the increase of eutectic substance, which incurs change of the composition, is inhibited, whereby a stacked piezoelectric element having good performance can be obtained.

One specific example of the material of inhibiting a eutectic reaction with each layer (material) is a material characterized in that the crystal structure is nearly the same as that of the objective material and at the same time, the melting point is higher. For example, the strengthening substance or a constituent element thereof preferably comprises a material having, when converted into an oxide, nearly the same crystal structure as the material constituting the piezoelectric ceramic layer, and having a melting point higher than that of the material constituting the ceramic layer.

It is also preferred that the strengthening substance, or a constituent element thereof, comprises a material having, when converted into an oxide, nearly the same crystal structure as the oxide of the electrically conducting base metal material constituting the electrode layer, and having a melting point higher than that of the oxide of the electrically conducting base metal material, which has nearly the same crystal structure.

Furthermore, it is preferred that the strengthening substance or a constituent element thereof has, when converted into an oxide, nearly the same crystal structure as a eutectic substance produced after firing only the material constituting the piezoelectric ceramic layer and the electrically conducting base metal material constituting the electrode layer or an oxide thereof, and has a melting point higher than that of the eutectic substance.

When the crystal structure is nearly the same, the phase equilibrium diagram is probably a complete solid solution system. In the case of a material having a complete solid solution system and having a higher melting point, melting does not occur at a temperature lower than the melting point of the original material. Furthermore, the strengthening substance physically inhibits the progress of a eutectic reaction or melting with the eutectic reaction and, therefore, the segregation of electrode material in the ceramic layer can be suppressed.

The meaning and specific examples of the "physical inhibition" as used herein are the same as those described for the first embodiment of the present invention. The meaning of the "nearly the same crystal structure" is also the same.

In the electrode paste material of the second embodiment of the present invention having all of these excellent properties, similarly to the first embodiment, the electrically conducting base metal material is preferably Cu or a mixture, alloy or compound containing Cu and Ni. Furthermore, the electrically conducting base metal material is preferably Ni, a mixture containing Ni, or an alloy or compound having a high Ni ratio. In this case, the electrically conducting base metal material is more readily reduced than the ceramic layer at the integral firing.

When the electrically conducting base metal as the main component of the electrode layer is Ni, the strengthening substance preferably has the same crystal structure as NiO which is an oxide of Ni. This crystal structure is a rock salt structure at a high temperature and therefore, the strengthening substance for enhancing the joining strength of the electrode layer to the piezoelectric ceramic layer is distributed in the vicinity of the boundary between the electrode layer and the piezoelectric ceramic layer. The strengthening substance or a constituent element thereof preferably takes, when converted into an oxide, a rock salt structure.

The oxide having a rock salt structure includes CaO. The rock-salt-structure CaO suppresses the eutectic reaction between NiO as an oxide of the electrode material and the ceramic material at a high temperature. At this time, as the purpose is to prevent the eutectic reaction, it may be sufficient if CaO is present in the temperature region of causing a eutectic reaction, and CaO need not be present in the constitution of the electrode paste material. Accordingly, for example, $CaCO_3$ may be used in the electrode paste material.

Also, when the electrically conducting base metal as the main component of the electrode layer is Cu, the strengthening substance preferably has the same crystal structure as CuO or $Cu_2O$ which are an oxide of Cu. This crystal structure is a cuprite structure or a monoclinic structure and therefore, the strengthening substance for enhancing the joining strength of the electrode layer to the piezoelectric ceramic layer is distributed in the vicinity of the boundary between the electrode layer and the piezoelectric ceramic layer. The strengthening substance or a constituent element thereof preferably takes, when converted into an oxide, a cuprite structure or a monoclinic structure.

In the stacked piezoelectric element, segregation of the electrode material is preferably not present between opposing electrodes capable of forming a potential difference. By this constitution, in the piezoelectric ceramic layer of undergoing displacement at the driving, a stress is not concentrated on the segregated part of the electrode material which does not undergo displacement, as a result, good durability is obtained. In the portion where electrodes differing in the potential are not opposed, a small displacement is not a problem, and segregation in the electrode material may be neglected. The meaning of "segregation" is the same as that described for the first embodiment.

According to the second embodiment of the present invention, in the method for producing a stacked piezoelectric element in which a piezoelectric ceramic layer and an electrode layer are alternately stacked, an alkali niobate compound is used as the main component of the piezoelectric ceramic layer. As a result, a stacked piezoelectric element free from problems of sublimation•liquefaction as encountered in the case of using Pb and excellent in the quality can be obtained.

As for the main component of the electrode paste material, an electrically conducting base metal material is preferably used or an electrically conducting base metal material and an oxide thereof are preferably used. By using a base metal, the cost can be decreased. Also, a very small amount of the base metal in the electrode layer is oxidized and the oxide partially causes a eutectic reaction with the alkali niobate compound in the ceramic layer, whereby the joining between the ceramic layer and the electrode layer is strengthened.

The electrically conducting base metal material is preferably Cu or a mixture, alloy or compound containing Cu and Ni. By this constitution, not only an electrode layer with good electrical conductivity can be formed but also integral firing at a low temperature can be realized and both the oxidized state of ceramic layer and the reduced state of electrode layer can be attained.

The electrically conducting base metal material is preferably Ni, a mixture containing Ni, or an alloy or compound having a high Ni ratio. By this constitution, integral firing at a high temperature can be performed.

At this time, the electrode paste material preferably comprises a material, when present together with the material constituting the piezoelectric ceramic layer, not decreasing the melting point of the material constituting said piezoelectric ceramic layer. By this constitution, the eutectic reaction between the material constituting the ceramic layer and the oxide of the electrode layer material is inhibited and, as a result, the atmosphere on the oxidizing side has a wide deviation allowable range and the atmosphere adjustment becomes relatively easy.

Also in the case where the electrode paste material comprises a material, when present together with the electrically conducting base metal material constituting the electrode layer or an oxide thereof, not decreasing the melting point of the electrically conducting base metal material constituting said electrode layer or an oxide thereof, the same effects can be expected.

The electrode paste material may comprise a material, when present together with a eutectic substance produced after firing only the material constituting the piezoelectric ceramic layer and the electrically conducting base metal material constituting the electrode layer or an oxide thereof, not decreasing the melting point of the eutectic substance. In this case, a eutectic reaction occurs, but the increase of eutectic substance along the change of composition is inhibited by the above-described material contained in the electrode paste material.

The materials in these three conditions can be specifically expressed as follows:

(1) to contain a material having nearly the same crystal structure as the material constituting the piezoelectric layer, and having a melting point higher than that of the material constituting the piezoelectric ceramic layer and having nearly the same crystal structure;

(2) to contain a material having nearly the same crystal structure as the oxide of the electrically conducting base metal material constituting the electrode layer, and having a melting point higher than that of the oxide of the electrically conducting base metal material, which has nearly the same crystal structure; or (3) to contain a material having nearly the same crystal structure as a eutectic substance produced after firing only the material constituting the piezoelectric ceramic layer and the electrically conducting base metal material constituting the electrode layer or an oxide thereof, and having a melting point higher than that of the eutectic substance having nearly the same crystal structure.

When the main component of the electrode material is Ni, NiO takes a rock salt structure at a high temperature and, therefore, the nearly the same crystal structure in the condition (2) above is a rock salt structure. That is, the electrode paste material comprises a material having a rock salt structure and having a melting point higher than the oxide of the electrically conducting base metal material constituting the electrode layer.

When the main component of the electrode material is Cu, $Cu_2O$ or CuO has a cuprite structure or a monoclinic structure and therefore, the nearly the same crystal structure in the condition (2) above is a cuprite structure or a monoclinic structure. That is, the electrode paste material comprises a material having a cuprite structure or a monoclinic structure and having a melting point higher than the oxide of the electrically conducting base metal material constituting the electrode layer. Examples of the material having a rock salt structure and having a melting point higher than the oxide of the electrically conducting base metal material constituting the electrode layer include CaO. As described above, it is sufficient if a predetermined material is present at a high temperature, and therefore, $CaCO_3$ may also be used other than CaO.

Other examples include a material becoming CaO as a result of separation of gas at a high temperature, and a Ca-containing organic material in which the constituent element is separated-decomposed along the oxidation. In addition, as long as CaO is produced at a high temperature, the material is not limited to such a material of singly undergoing separation, decomposition or reaction, but a mode of incorporating two or more materials and causing these materials to react in the process may also be employed.

EXAMPLES

Example 1

Figure 2:
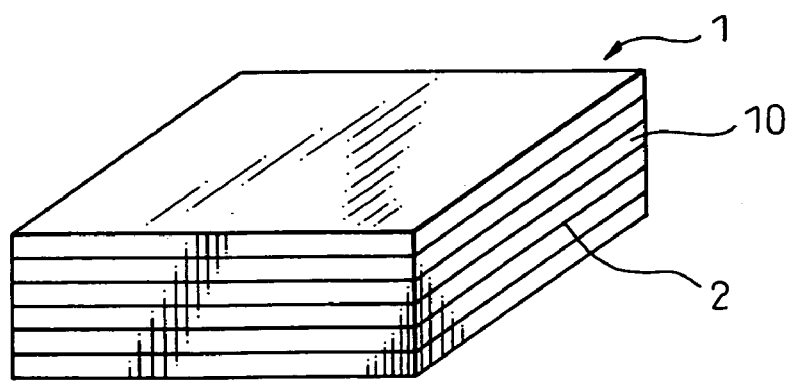
FIG. 2 is an explanatory view showing the stacked piezoelectric element in Example 1.
Figure 3:
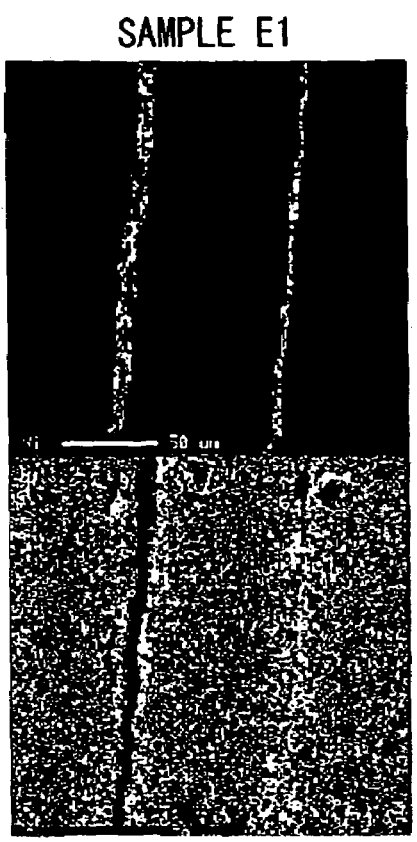
FIG. 3 is an explanatory view showing the distribution of elements Ni and Ca in Sample E1 of Example 1.
Figure 4:
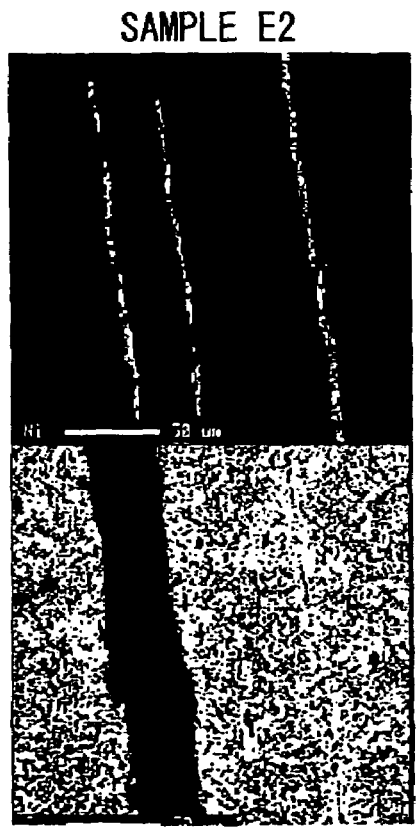
FIG. 4 is an explanatory view showing the distribution of elements Ni and Ca in Sample E2 of Example 1.
Figure 5:
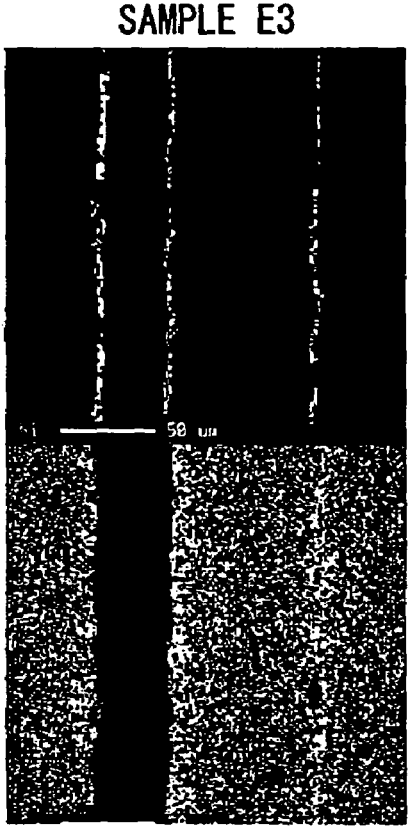
FIG. 5 is an explanatory view showing the distribution of elements Ni and Ca in Sample E3 of Example 1.
Figure 6:
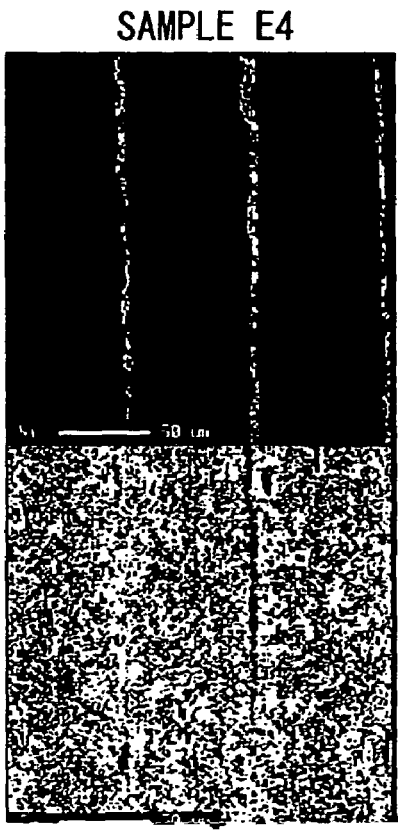
FIG. 6 is an explanatory view showing the distribution of elements Ni and Ca in Sample E4 of Example 1.

The stacked piezoelectric element according to Example of the present invention is described. An electrode paste material was printed on a ceramic sheet comprising a lead-free $KNbO_3$-based material (having a replacing element in both A-site and B-site) and dried. After stacking, press-bonding and degreasing, the stack was fired in an $N_2$ atmosphere to produce a stacked piezoelectric element 1 comprising a six-layer stacked product in which, as shown in FIG. 2, a piezoelectric ceramic layer 10 and an electrode layer 2 were alternately stacked. A plurality of samples were produced by changing the constitution in the electrode paste material, and the diffusion and segregation state of electrode after firing in an $N_2$ atmosphere having a weak reducing power was compared. Respective steps are described in detail later.

As for the electrode paste material, the host material was common and the kind and amount of additive added thereto were changed to produce a plurality of samples (Invention Samples E1 to E4 and Comparative Samples C1 and C2).

The constitution of host material is shown in Table 1, and details of the additive added to each sample are shown in Table 2.

TABLE 1

(Table 1) Constitution of Electrode Paste Material (Constitution of Host Material)

| Ni/NiO Ratio (by mol) | Ni + NiO Content Ratio (wt %) | Organic Vehicle (wt %) | Total (%) |
| --- | --- | --- | --- |
| 50/50 | 60 wt % | 40 wt % | 100% |

TABLE 2

(Table 2) Additive and Amount Added to Host Material in Electrode Paste Material

| | Name of Sample | Strengthening Additive | Host Material (wt %) | Amount Added (wt %) | Total (wt %) |
| --- | --- | --- | --- | --- | --- |
| Invention | Sample E1 | diethoxy calcium | 100 | 2.44 | 102.44 |
| | Sample E2 | diethoxy calcium | 100 | 6.10 | 106.10 |
| | Sample E3 | di-n-butoxy calcium | 100 | 3.72 | 103.72 |
| | Sample E4 | di-n-butoxy calcium | 100 | 9.30 | 109.30 |
| Comparison | Sample C1 | $CaCO_3$ | 100 | 2.00 | 102.00 |
| | Sample C2 | $CaCO_3$ | 100 | 5.00 | 105.00 |

(Production Method of Stacked Piezoelectric Element)

A green sheet obtained by shaping a ceramic material into a sheet form was produced by using a doctor blade method. First, powders of oxides or carbonic acid compounds each containing a constituent element of the piezoelectric material for the ceramic layer were prepared. In this Example, powders of MgO, $K_2CO_3$, $Na_2CO_3$, $Nb_2O_5$ and the like were prepared. These raw material powders were weighed to give a desired composition and blended. This blend was dry-mixed in a mixer and then temporarily fired at 800 to 1,000° C.

Subsequently, pure water and a dispersant were added to the temporarily fired powder to form a slurry and the slurry was wet-ground by a pearl mill. This ground product was dried and powder-degreased and, after adding thereto a solvent, a binder, a plasticizer, a dispersant and the like, these were mixed in a ball mill. The resulting slurry was subjected to vacuum defoaming and adjustment of viscosity while stirring with a stirrer in a vacuum device.

This slurry was then shaped into a green sheet with a constant thickness by using a doctor blade device. The recovered green sheet was stamped by a press or cut by a cutter and thereby shaped into a rectangular body having a predetermined size.

On the other hand, the electrode paste material was prepared as follows.

After obtaining an organic vehicle {containing a resin material (e.g., acrylic resin, arachidonic resin, Ethocel-type resin)} by dissolving ethyl cellulose in terpineol, an Ni powder {SNP-YH6, produced by Sumitomo Metal Mining Co., Ltd.} and an NiO powder (a material having an average particle diameter of 1 to 2 μm and a particle size distribution of 0.2 to 5 μm), were kneaded with the organic vehicle to give a blending ratio shown in Table 1, thereby producing a host material, and the additive shown in Table 2 was added to each host material and thoroughly mixed to produce an electrode paste material.

Using each desired electrode paste material, a pattern was formed by screen printing on one surface of each of five shaped green sheets. In this Example, the printing thickness was set to 20 μm.

Thereafter, as shown in FIG. 1, six green sheets including a green sheet not printed with the electrode paste material were stacked. At this time, five green sheets printed with the electrode paste material were all stacked by aligning their printed surfaces in the same direction. The green sheet not printed with the electrode paste material was stacked in the portion where the printed surface was revealed outside. Also, here, the electrode paste material was printed in advance not to reach at least one side surface of the green sheet and, at the stacking, the green sheets were stacked such that the side surface unreached by the printing of electrode paste material came to right and left alternately, in other words, the electrode paste material reached the right and left side surfaces alternately.

Each stack obtained above was fixed in a press-bonding jig and thermally press-bonded at a temperature of 110° C. under a pressure of 16 MPa for 1 minute. The thermally press-bonded stack was cut by a sheet cutter into a size of 9 mm by 9 mm and then flattened by applying a pressure of 7 or 8 MPa in the stacking direction at an ordinary temperature.

This stacked product was placed in a gas circulation-type degreasing furnace, left standing in air under heating at a temperature of 550° C. for 10 hours, thereby effecting degreasing, and then fired in an $N_2$ atmosphere. The firing temperature was 1,250° C. and the firing time was 8 hours.

The thus-obtained stacked piezoelectric element 1 comprising a six-layer stacked product (see, FIG. 2) was cut at the plane passing the center part of the stacked product and at the same time, being perpendicular to the sheet face, and 5 points on the cut plane were enlarged 700 times and analyzed by EPMA. On the 5 points of the plane enlarged 700 times, the distribution of component elements Ni and Ca (distribution range•position and distribution amount at the point where the component element was distributed) was measured. The results are shown in FIGS. 3 to 8 (in all cases, the stacking direction is horizontal).

Figure 7:
FIG. 7 is an explanatory view showing the distribution of elements Ni and Ca in Sample C1 of Example 1.
Figure 8:
FIG. 8 is an explanatory view showing the distribution of elements Ni and Ca in Sample C2 of Example 1.

In Comparative Sample C1 (where 2 wt % of $CaCO_3$ was added), as shown in FIG. 7, a large amount of Ni bled out from the electrode layer and Ni segregated in the ceramic layer. In Comparative Sample C2, as shown in FIG. 8, Ni did not segregate in the ceramic layer, but segregation of the component element Ca contained in $CaCO_3$ of which amount added was increased from 2 wt % to 5 wt %, was observed.

On the other hand, as shown in FIGS. 3 to 6, in Invention Samples E1 to E4 where the additive was added to give the same Ca atom amount as in Comparative Samples C1 and C2, the component elements Ni and Ca did not segregate. Furthermore, the component element Ca was relatively uniformly distributed in each of the electrode layer and the ceramic layer.

Example 2

The following samples were produced through the same process as in Example 1, and the percentage shrinkage was compared with Invention Samples E1 to E4 of Example 1.

<Invention Sample E21>

In the electrode paste material of Invention Sample E1, 5 wt % of a ceramic material was added. Other constitutions and steps all were the same as those for Invention Sample E1 (the ceramic material used here was the same as the material used for the sheet; hereinafter the same until E34).

<Invention Sample E22>

In the electrode paste material of Invention Sample E2, 5 wt % of a ceramic material was added. Other constitutions and steps all were the same as those for Invention Sample E2.

<Invention Sample E23>

In the electrode paste material of Invention Sample E3, 5 wt % of a ceramic material was added. Other constitutions and steps all were the same as those for Invention Sample E3.

<Invention Sample E24>

In the electrode paste material of Invention Sample E4, 5 wt % of a ceramic material was added. Other constitutions and steps all were the same as those for Invention Sample E4.

<Invention Sample E31>

In the electrode paste material of Invention Sample E1, 10 wt % of a ceramic material was added. Other constitutions and steps all were the same as those for Invention Sample E1.

<Invention Sample E32>

In the electrode paste material of Invention Sample E2, 10 wt % of a ceramic material was added. Other constitutions and steps all were the same as those for Invention Sample E2.

<Invention Sample E33>

In the electrode paste material of Invention Sample E3, 10 wt % of a ceramic material was added. Other constitutions and steps all were the same as those for Invention Sample E3.

<Invention Sample E34>

In the electrode paste material of Invention Sample E4, 10 wt % of a ceramic material was added. Other constitutions and steps all were the same as those for Invention Sample E4.

<Invention Sample E41>

In the electrode paste material of Invention Sample E1, 5 wt % of Ceramic Material 2 was added. Other constitutions and steps all were the same as those for Invention Sample E1 (Ceramic Material 2 used here was a single substance: $KNbO_3$).

<Test Results>

The length of one side, which was 9 mm before firing in all samples, was changed as follows. The results are shown in Table 3.

TABLE 3

(Table 3) Comparison of Length after Shrinkage by Firing

| Name of Sample | Length of One Side Side after Firing |
|---|---|
| Invention Sample E 21 | 7.78 mm |
| Invention Sample E 22 | 7.77 mm |
| Invention Sample E 23 | 7.79 mm |
| Invention Sample E 24 | 7.78 mm |
| Invention Sample E 31 | 7.77 mm |
| Invention Sample E 32 | 7.78 mm |
| Invention Sample E 33 | 7.77 mm |
| Invention Sample E 34 | 7.76 mm |
| Invention Sample E 41 | 7.76 mm |
| Invention Sample E 1 | 8.02 mm |
| Invention Sample E 2 | 8.01 mm |
| Invention Sample E 3 | 8.03 mm |
| Invention Sample E 4 | 8.02 mm |

As seen from Table 3, in all of Invention Samples E21 to E24, E31 to E34 and E41, the length after firing was shorter than that in Invention Samples E1 to E4 and this reveals that a sample having good sinterability was obtained. Incidentally, as the reaction at the sintering occurs in the order of reaction at the interface between electrode and ceramic layer→shrinkage of electrode/shrinkage of ceramic, it is considered that there was a difference in the shrinking property of ceramic layer but not in the interfacial separation.

Example 3

The same stacked products as Invention Samples E1 to E4 produced in Example 1 were produced. Three units were prepared for each stacked product. Also, 5 units of a six-layer stacked product (Invention Sample E5) were produced in the same manner except for using a paste material not containing a strengthening substance in the constitution of Table 1. On the other hand, as a comparative sample, 5 units of a six-layer stacked product were produced in the same manner except for using an Ag-Pd (85:15 mol %) paste material and changing the atmosphere. As for the atmosphere, the firing was performed in air (Comparative Sample C3).

One simple plane of each sample prepared above was bonded on a plate, and a bar-like material was bonded to the center part on the other side, that is, on the uppermost part. After the adhesive was hardened, the bar-like material was pulled upward by hand and the separated face was observed by eye.

In the case of Invention Samples E1 to E4, separation was generated within the ceramic layer part in all of total 12 units and was not observed at the interface between the electrode layer and the ceramic layer. In the case of Invention Sample E5, separation was generated within the ceramic layer in 4 units. In the remaining one unit, a portion where separation was generated within the ceramic layer and a portion where separation was generated at the interface between the ceramic layer and the electrode layer were present at a ratio of approximately fifty-fifty.

On the other hand, in the case of Comparative Sample C3, separation was generated at the interface between the ceramic layer and the electrode layer in all of 5 units (the ceramic layer was not completely free of a separated portion therein, but separation at the interface of the ceramic layer and the electrode layer occupied 80% or more by area).

It is seen from these results that the joining strength at the interface between the electrode layer and the ceramic layer is enhanced by using a base metal as the electrode material and the joining at the interface between the electrode layer and the ceramic layer is more strengthened by the addition of a strengthening substance.

What is claimed is:

1. A stacked piezoelectric element obtained by alternately stacking a piezoelectric ceramic layer and an electrode layer, wherein
    said electrode layer mainly comprises an electrically conducting base metal electrode material,
    the region held between the electrode layer positioned at the top of each ceramic layer and the electrode layer positioned at the bottom of each ceramic layer contains a material having no piezoelectricity, in which a constituent element of said material having no piezoelectricity is uniformly dispersed so as not to have local distribution of a distributed strength exceeding 2 times the distributed strength which is distributed in a largest number of places and is not 0; and
    the constituent element of said material having no piezoelectricity, which is uniformly dispersed in said region held between the electrode layers positioned at the top and the bottom of the ceramic layer, is Ca.

2. The stacked piezoelectric element as claimed in claim 1, wherein said electrically conducting base metal material has a larger standard Gibbs free energy for producing a metal oxide at the sintering temperature than that of the ceramic material constituting the piezoelectric ceramic layer.

3. The stacked piezoelectric element as claimed in claim 2, wherein said region held between the electrode layers positioned at the top and the bottom of each ceramic layer has no segregation of a compound containing a component element of the electrically conducting base metal material constituting said electrode layer.

4. The stacked piezoelectric element as claimed in claim 1, wherein the main component of the electrically conducting base metal material constituting said electrode layer is Cu, Ni or a mixture, alloy or compound containing Cu and Ni.

* * * * *